United States Patent
Zou et al.

(10) Patent No.: US 7,104,140 B2
(45) Date of Patent: Sep. 12, 2006

(54) HIGH SENSITIVITY, LOW NOISE PIEZOELELCTRIC FLEXURAL SENSING STRUCTURE USING <011> POLED RELAXOR-BASED PIEZOELECTRIC SINGLE CRYSTALS

(75) Inventors: Lichun Zou, Vienna, VA (US); Ken Kan Deng, Potomac, MD (US)

(73) Assignee: Wilcoxon Research, Inc., Gaithersburg, MD (US)

( * ) Notice: Subject to any disclaimer, the term of this patent is extended or adjusted under 35 U.S.C. 154(b) by 0 days.

(21) Appl. No.: 11/011,198

(22) Filed: Dec. 15, 2004

(65) Prior Publication Data

US 2005/0132816 A1    Jun. 23, 2005

(51) Int. Cl.
*G01B 7/16* (2006.01)
(52) U.S. Cl. ....................................................... 73/777
(58) Field of Classification Search ................ 73/760, 73/763, 774, 514.34, 654, 649, 777, 862.639; 310/329, 360, 333
See application file for complete search history.

(56) References Cited

U.S. PATENT DOCUMENTS

| | | | | |
|---|---|---|---|---|
| 3,735,161 | A * | 5/1973 | Perkins et al. | 310/329 |
| 4,104,920 | A * | 8/1978 | Albert et al. | 43/514.14 |
| 4,467,235 | A * | 8/1984 | De Wames et al. | 310/313 D |
| 6,715,363 | B1 | 4/2004 | Deng et al. | |
| 6,865,945 | B1 * | 3/2005 | Hayashi et al. | 73/504.16 |
| 2003/0119220 | A1 * | 6/2003 | Mlcak et al. | 438/52 |
| 2004/0095046 | A1 * | 5/2004 | Ouchi et al. | 310/370 |
| 2004/0187574 | A1 * | 9/2004 | Hayashi et al. | 73/514.16 |
| 2005/0034519 | A1 * | 2/2005 | Deng | 73/514.34 |

* cited by examiner

*Primary Examiner*—Max Noori
(74) *Attorney, Agent, or Firm*—Paul Davis; Heller Ehrman LLP

(57) ABSTRACT

A piezoelectric flexural sensing structure having increased sensitivity and decreased noise, without sacrifice of the sensor bandwidth. The structure is made up of a proof mass, a beam with a base and optionally having castellated bonding surfaces and two <011> poled bonding mode PMN-PT crystal plates mounted on the beam.

9 Claims, 1 Drawing Sheet

HIGH SENSITIVITY, LOW NOISE PIEZOELELCTRIC FLEXURAL SENSING STRUCTURE USING <011> POLED RELAXOR-BASED PIEZOELECTRIC SINGLE CRYSTALS

GOVERNMENT INTEREST

The present invention was made under United States Navy Office of Naval Research Contract No. N00014-02-M-0171.

FIELD OF THE INVENTION

The present invention is directed to a piezoelectric flexural sensing structure having increased sensitivity and decreased noise, without sacrificing bandwidth.

BACKGROUND OF THE INVENTION

Conventionally, a piezoelectric coefficient $d_{31}$ value of piezoelectric materials, such as PZT, <100> poled PMN-PT single crystals, is a half value of its piezoelectric coefficient $d_{33}$. Due to reduced piezoelectric properties compared to the $d_{33}$ mode, a heavy mass (large size sensors) or narrow bandwidth must be adapted to achieve high piezoelectric output. All the old solutions suffered from either lower piezoelectric output (high noise level) or reduced bandwidth when a senor was kept to the same size.

SUMMARY OF THE INVENTION

A purpose of the present invention is to increase the sensitivity and decrease the noise of a piezoelectric flexural sensing structure by utilizing the <011> poled PMN-PT single crystal, which possesses the highest piezoelectric coefficient $d_{31}$ value, and a novel lateral constraint (clamping effect) alleviation mechanism.

By utilizing a <011> poled PMN-PT single crystal, which possesses the highest piezoelectric coefficient $d_{31}$ value, combined with a novel lateral constraint (clamping effect) alleviation mechanism, a piezoelectric flexural sensing structure with much higher charge sensitivity and lower noise can be realized.

The present invention is directed to a piezoelectric flexural sensing structure which is made up of a proof mass, a beam with a base and optionally having castellated bonding surfaces and two <011> poled bending mode PMN-PT crystal plates mounted on the beam or the castellated bonding surfaces if the beam has such surfaces. The use of castellations to improve sensor performance is disclosed in U.S. Pat. No. 6,715,363 issued to Deng et al. and entitled "Method and Apparatus for Strain Amplification for Piezoelectric Transducers." U.S. Pat. No. 6,715,363 is incorporated by reference herein.

BRIEF DESCRIPTION OF THE DRAWINGS

A first embodiment of the invention is shown in the FIG. 1, which shows a piezoelectric flexural sensing structure with <011> poled PMN-PT crystals.

A second embodiment of the invention is shown in the FIG. 2, which shows a piezoelectric flexural sensing structure combined with a novel lateral constraint alleviation mechanism.

DETAILED DESCRIPTION OF THE PREFERRED EMBODIMENT

Figure 1:
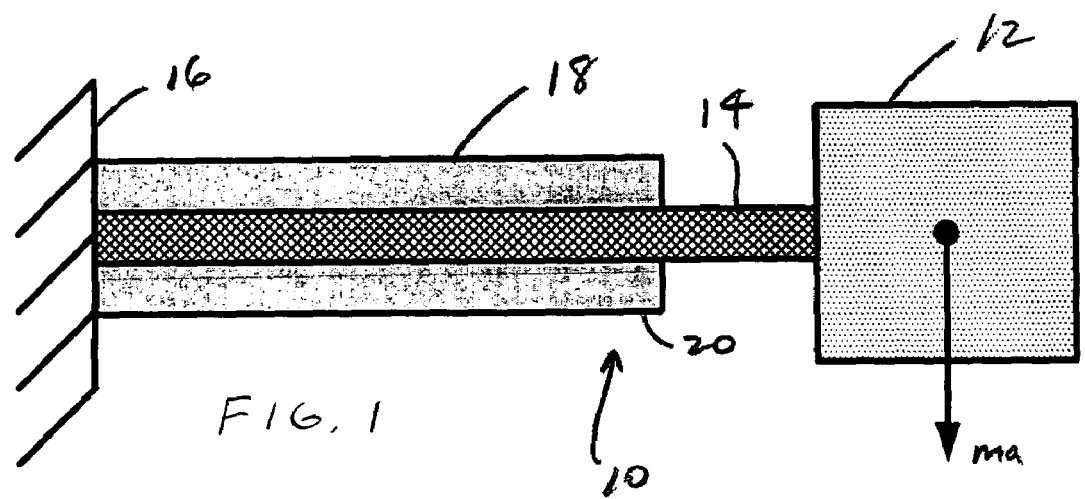

Referring now to the drawings, a first embodiment of the invention is shown in FIG. 1. In the first embodiment, a bending mode using two piezoelectric crystals mounted on a beam is selected as a basic sensing element. This sensing structure 10 consists of a proof mass 12, a beam 14 with a base 16, and two <011> poled bending mode PMN-PT crystal plates 18, 20 mounted on opposite surfaces of the beam 14. A unique feature incorporated in this sensing structure is that the <011> poled PMN-PT single crystal plates 18, 20 have a 40% higher $d_{31}$ piezoelectric coefficient when compared to other poling orientations. This structure is a significant improvement in piezoelectric output of the sensing structure 10.

Figure 2:
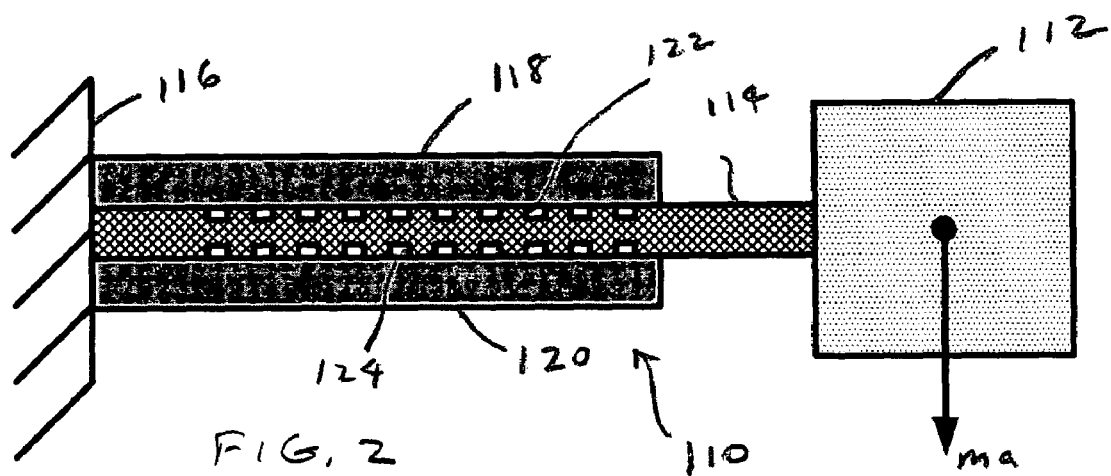

In a second embodiment of the invention, a bending mode using two piezoelectric crystals on a beam is also selected as a basic sensing element, but with an additional feature. This sensing structure 110, which is shown in FIG. 2, consists of a proof mass 112, a beam 114 with a base 116, and two <011> poled bending mode PMN-PT crystal plates 118, 120 mounted on opposite surfaces of the beam 114. Two unique features are incorporated in this sensing structure. First is that the <011> poled PMN-PT single crystal plates 118, 120 have a 40% higher $d_{31}$ piezoelectric coefficient when compared to other poling orientations. The second is that the bonding surfaces 122, 124 are castellated, i.e., the protrusions 122, 124 are made on the beam gluing surfaces in order to reduce the bonding area on the crystal plates 118, 120 and effectively mitigate the lateral constraint from the gluing surface on the crystal. This results in a significant improvement in the piezoelectric output of the sensing structure 110.

The old methods employ <100> poled PMN-PT single crystals or other piezoelectric materials, which have low piezoelectric coefficient $d_{31}$ values, and results in low piezoelectric output and high noise. In contrast, the current invention utilizes new piezoelectric materials, a <011> poled single crystal and a unique bonding surface. This results in the piezoelectric flexural sensing structures presenting a higher sensitivity and lower noise with same dimensions of the sensing structure.

The performance comparison shows that the application of <011> poled crystal with a bending mode sensing structure results in an increase of the piezoelectric output for the sensing structure by a factor of two (~6 dB). Most significantly, it decreases noise level by 6 dB, which meet today's high technology demands on the sensor noise level.

The invention has been disclosed broadly and illustrated in reference to two representative embodiments described above. Those skilled in the art will recognize that various modifications can be made to the present invention without departing from the spirit and scope thereof.

What is claimed is:

1. A piezoelectric flexural sensing structure comprising:
   (a) a beam;
   (b) a base to which a first end of the beam is attached;
   (c) a proof mass attached to a second end of the beam; and
   (d) a <011> poled single crystal piezoelectric crystal attached to the beam that produces an electric signal configured to measure an inertial force or acceleration.

2. The piezoelectric flexural sensing structure of claim 1, wherein the beam includes castellations to which the <011> poled single crystal piezoelectric crystal is attached.

3. The piezoelectric flexural sensing structure of claim 1, further comprising two <011> poled single crystal piezoelectric crystals attached to opposite surfaces of the beam.

4. The piezoelectric flexural sensing structure of claim 3, wherein the beam includes castellations to which the <011> poled single crystal piezoelectric crystals are attached.

5. A piezoelectric flexural sensing structure comprising:
(a) a beam having castellations on two sides;
(b) a base to which a first end of the beam is attached;
(c) a proof mass attached to a second end of the beam; and
(d) a pair of <011> poled single crystal piezoelectric crystals, said crystals mounted on the castellations on opposite sides of the beam, the beam producing an electric signal configured to measure an inertial force or acceleration.

6. A piezoelectric flexural sensing structure comprising:
(a) a hetero-bimorph beam having at least one mounting surface, said at least one mounting surface selected from the group of surfaces having no castellations thereon and those having castellations thereon;
(b) a base to which a first end of the beam is attached;
(c) a proof mass attached to a second end of the beam; and
(d) at least one <011> poled single crystal piezoelectric crystal, said at least one <011> poled single crystal piezoelectric crystal mounted on said at least one mounting surface of said hetero-bimorph beam, the hetero-bimorph beam producing an electric signal configured to measure an inertial force or acceleration.

7. A piezoelectric flexural sensing structure comprising:
(a) a hetero-bimorph beam having a pair of mountaing surfaces, said mountain surfaces selected from the group of surfaces having no castellations thereon and those having castellations thereon;
(b) a base to which a first end of the hetero-bimorph beam is attached;
(c) a proof mass attached to a second end of the hetero-bimorph beam; and
(d) a pair of <011> poled single crystal piezoelectric crystals, said crystals mounted on the mounting surfaces of said hetero-bimorph beam, the hetero-bimorph beam producing an electric signal configured to measure an inertial force or acceleration.

8. A piezoelectric flexural sensing structure comprising:
(a) a beam;
(b) a base to which a first end of the beam is attached;
(c) a proof mass attached to a second end of the beam; and
(d) a <011> poled single crystal piezoelectric crystal attached to the beam, wherein the piezoelectric crystal is a <011> poled bonding mode PMN-PT crystal.

9. A piezoelectric flexural sensing structure comprising:
(a) a beam;
(b) a base to which a first end of the beam is attached;
(c) a proof mass attached to a second end of the beam; and
(d) a <011> poled single crystal piezoelectric crystal attached to the beam, wherein the piezoelectric crystal is oriented to maximize a piezoelectric coefficient $d_{31}$ of the piezoelectric crystal.

* * * * *